United States Patent [19]

Kelly et al.

[11] Patent Number: 5,081,512
[45] Date of Patent: Jan. 14, 1992

[54] ELECTRONIC DEVICES

[75] Inventors: Michael J. Kelly, London; Micahel Pepper, Cambridge; Robert J. Brown, Cambridge; Charles G. Smith, Cambridge, all of England; David A. Wharam, Munich, Fed. Rep. of Germany

[73] Assignee: The General Electric Company p.l.c., England

[21] Appl. No.: 520,646

[22] Filed: May 8, 1990

[30] Foreign Application Priority Data

May 10, 1989 [GB] United Kingdom ............. 8910783

[51] Int. Cl.$^5$ ............. H01L 29/80; H01L 27/12; H01L 29/161; H01L 29/48
[52] U.S. Cl. ............. 357/22; 357/16; 357/4; 357/15
[58] Field of Search ............. 357/22 A, 22 MD, 16, 357/4, 15

[56] References Cited

PUBLICATIONS

Journal of Physics C: Solid State Physics, vol. 21, 1988, pp. L209-L214, IOP Publishing Ltd., London; D. A. Wharam et al., "One-Dimensional Transport and the Quantisation of the Ballistic Resistance".
Physical Review Letters, vol. 58, No. 24, Jun. 15, 1987, pp. 2586-2589, The American Physical Society, New York; W. Hansen et al; "Intersubband Inversion Channels".
Electronics Letters, vol. 25, No. 15, Jul. 20, 1989, pp. 992-993; M. J. Kelly, et al; "One-Dimensional Ballistic Resistor in Hot-Electron Regime: Nonlinear and Negative Differential Resistance to 10 THz".
Physical Review B., vol. 39, No. 11, Apr. 15, 1989, pp. 8040-8043, The American Physical Society; L. P. Kouwenhoven et al; "Nonlinear Conductance of Quantum Point Contacts".

Primary Examiner—Rolf Hille
Assistant Examiner—Wael Fahmy
Attorney, Agent, or Firm—Kirschstein, Ottinger, Israel & Schiffmiller

[57] ABSTRACT

Semiconductor apparatus comprises a split-gate semiconductor device (1) which has a first layer (3) of a first undoped semiconductor material (e.g. GaAs) and a second layer (4) of a second semiconductor material (e.g. AlGaAs) which is doped through at least part of its thickness. The second material has a higher energy band gap than the first material, and the layers form a heterojunction so that electrons from the second layer collect in the first layer to form a two-dimensional electron gas. Drain and source contacts (7,6) are provided on the second layers, and a gate electrode (8) is so configured that on application of a sufficiently large negative bias to the gate electrode a constriction is formed in the first layer through which only a one-dimensional electron gas can pass between the source and drain contacts. The apparatus also includes a bias supply (17) for applying a bias voltage between the source and drain contacts. The source/drain bias is made equal to or greater than $E_f/e$ where $E_f$ is the Fermi energy of electrons in the two-dimensional gas and e is the electron charge. As a result of the large source drain bias, the device exhibits negative resistance, and the apparatus can be used as an oscillator or a detector, operating in the Thz range.

8 Claims, 2 Drawing Sheets

ELECTRONIC DEVICES

BACKGROUND OF THE INVENTION

1. Field of the Invention

This invention relates to electronic devices, and particularly to devices incorporating the so-called "split gate" structure or its equivalent.

2. Description of Related Art

A known split-gate structure comprises a substrate of undoped gallium arsenide on which is formed a layer of aluminium gallium arsenide. Source and drain contacts are provided on the AlGaAs layer, and a metal Schottky electrode gate is also formed over part of that layer. The structure is therefore basically a device of the high-electron-mobility transistor (HEMT) type, in which the electron gas is confined to a very thin region of the GaAs layer adjacent the GaAs/AlGaAs interface. The electron transport is therefore virtually two-dimensional, and parallel to the interface. However, in the split gate device a very short and narrow (e.g. $\leq 1$ μm long and $\leq 1$ μm wide) gap is formed across the gate electrode, the gap extending in a direction from the source electrode to the drain electrode. When a negative gate bias voltage of sufficient magnitude is applied to the device, the electron path from the source to the drain is virtually cut off, and electrons can pass only under the gap. The electron transport is reduced to one dimension. The relevant electron states which carry the current are called sub-bands. The action is as follows. Electrons cannot occupy the same energy state and they therefore increase in energy with increasing number. The maximum value of electron momentum corresponds to the Fermi level or energy $E_f$, which at low temperature (e.g. 77° K.) is the highest occupied energy state. All sub-bands must be occupied up to the same total energy or the electrons will redistribute themselves to achieve that result. The higher sub-bands therefore contain fewer electrons.

As the negative gate bias voltage is increased, the width of the electron channel decreases. This increases the energy of the sub-bands. The sub-band with the maximum energy then becomes too high in energy to remain occupied, and the electrons which were in it pass into other levels. As the negative bias is further increased, the levels successively depopulate until the only electrons remaining are in the ground-state sub-band.

The flow of current through the gap is determined by the electron concentration and the electron velocity at the Fermi energy. Where there is no scattering, the change in kinetic energy of the electrons is determined by the source/drain voltage V.

It can be shown that the current J is given by $$J = 2ie^2 V/h \tag{1}$$

where i is the number of sub-bands present, e is the electron charge, h is Planck's constant and the factor 2 counts electron spin. From equation (1) it follows that the resistance R of the constricted path under the gap is given by $$R = \frac{V}{J} = h/2ie^2 \tag{2}$$

The terms are all constants, and for a single sub-band the equation gives a resistance of 25.7 kΩ, irrespective of the parameters of the material and the length of the gap. If more than one sub-band is present, the resistance is reduced accordingly. The ballistic resistor formed by the split gate structure does not follow the normal laws for connection of resistors in series or in parallel. If two equal split gates are located in series between the source and drain electrodes, the resistance will remain equal to that of a single split gate device. If, due to their having unequal numbers of sub-bands, the resistors are of unequal values, the total resistance of two such resistors in series will be equal to that of the larger-value resistor. The resistance of such devices therefore, apparently, can vary only in quantised steps depending upon the number of sub-bands present. Otherwise, the resistance is constant.

SUMMARY OF THE INVENTION

However, the present inventors have found an additional and quite different effect in such devices, which gives rise to a semiconductor apparatus which can be used as a very-high-frequency oscillator or detector.

According to the invention there is provided semiconductor apparatus comprising a semiconductor device having a first layer of a first undoped semiconductor material, a second layer of an at least partially doped second semiconductor material of higher electron energy band gap than said first material and forming a heterojunction with said first layer whereby electrons from said second layer collect in said first layer to form a two-dimensional electron gas, spaced-apart drain and source contacts on said second layer, and a gate electrode associated with said second layer and located between said drain and source contacts, said gate electrode being configured such that on application of a negative bias of sufficient magnitude to said gate electrode at least one constriction is formed in said first layer through which only a one-dimensional electron gas can pass between the source and drain contacts; said apparatus further comprising means to apply between the source and drain contacts a bias voltage substantially equal to or greater than $E_f/e$, where $E_f$ is the Fermi energy of electrons in said two-dimensional electron gas and e is the electron charge.

Preferably said first semiconductor layer comprises a layer of GaAs, and preferably said second semiconductor layer comprises a layer of AlGaAs.

The source/drain bias may be sufficiently greater than $E_f/e$ such that the device exhibits a negative differential resistance characteristic. The apparatus may then form an oscillator having a very high operating frequency.

BRIEF DESCRIPTION OF THE DRAWINGS

Embodiments of the invention will now be described, by way of example, with reference to the accompanying drawing, in which.

DETAILED DESCRIPTION OF THE PREFERRED EMBODIMENTS

Figure 1:
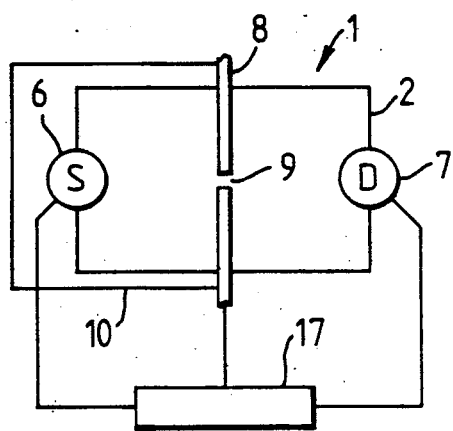
FIG. 1 is a schematic plan view of one form of semiconductor device for use in apparatus in accordance with the invention.
Figure 2:
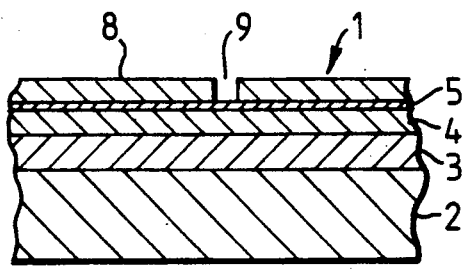
FIG. 2 is a schematic cross-sectional view of the device of FIG. 1, rotated through 90°.

Referring to FIGS. 1 and 2, a split-gate transistor 1 comprises a substrate 2 of undoped GaAs on which is grown, by molecular beam epitaxy or metal-organic chemical vapour deposition, an undoped layer 3 of GaAs of, for example, 1-2 $\mu$m thickness. A layer 4 of $Al_xGa_{1-x}As$, where x may be between about 0.25 and 0.4, is deposited on the layer 3 to a thickness of, say, 100 nm. That part of the layer 4 beyond, say, the first 20 nm is silicon doped to a level of, say, $10^{18} cm^{-3}$. A capping layer 5 of, for example, 10 nm thickness of GaAs is deposited over the layer 4.

Electrons from the doped AlGaAs layer 4 collect in the GaAs layer 3 at the AlGaAs/GaAs interface to form a two-dimensional electron gas with an electron density in a range of, say, $10^{11}$ to $10^{12} cm^{-2}$. A mesa can be defined, typically tens of microns in each dimension in the substrate plane, by conventional etching procedures. Standard ohmic contacts 6,7 are provided at opposite ends of the layer 4 to act as source and drain contacts, respectively.

A Schottky gate 8 is formed on the capping layer 5 by electron beam lithography. The gate 8 comprises a metal track extending across the mesa perpendicular to a notional line joining the centres of the contacts 6,7. The metal track is approximately 1 $\mu$m wide and has a transverse gap 9 of the order of 1 $\mu$m wide at about the middle of its length. The track portions are interconnected, as schematically indicated by a line 10, off the area of the mesa.

Figure 3:
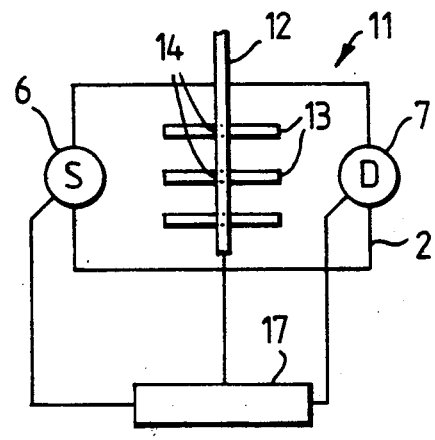
FIG. 3 is a schematic plan view of a second form of semiconductor device for use in apparatus in accordance with the invention.
Figure 4:
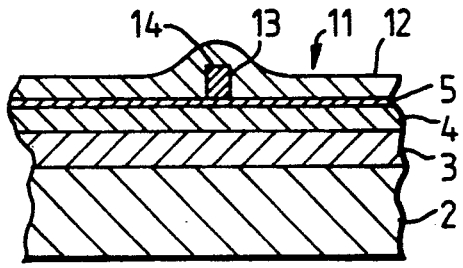
FIG. 4 is a schematic cross-sectional view of the device of FIG. 3, rotated through 90°.

Referring to FIGS. 3 and 4, in an alternative form of semiconductor device 11 the split track of the gate electrode 8 is replaced by a continuous metal track 12 which passes over one or more dielectric strips 13 of, say, 1 $\mu$m width and 2-3 $\mu$m thickness which extend transversely of the track. Each point 14 where the track 12 crosses a dielectric strip 13 is equivalent to the gap 9 of FIGS. 1 and 2. Otherwise, the device of FIGS. 2 and 3 has similar layers to the device of FIGS. 1 and 2. It will be apparent that the device of FIGS. 2 and 3 does not require the provision of a connection between track portions as does the FIGS. 1 and 2 device. Each dielectric strip 13 holds the track 12 away from the underlying layers, so that the track is less effective at each crossing point 14.

Figure 5:
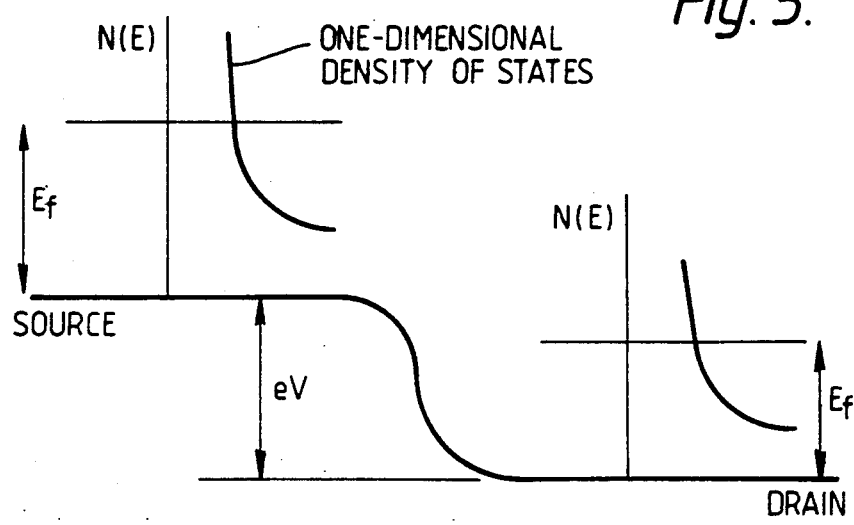
FIG. 5 illustrates electron states involved in current flow between source and drain electrodes of the semiconductor devices.

The mode of operation of the devices is initially as described briefly above. This will now be described in more detail. A negative bias is applied to the gate electrode 8 or 12 from a supply 17. This repels the electrons in the two-dimensional electron gas away from the region directly beneath the gate electrode. This repulsion is absent under the gap 9 of the gate 8 of FIGS. 1 and 2, or is less effective under the crossing points 14 of the track 12 of FIGS. 2 and 3, as the case may be. The source is biased negatively relative to the drain. Electrons can enter, cross and leave the mesa only if they pass through the channel under the gap 9 or under a crossing point 14. A gate bias of, say, $-2$ volts is sufficient to constrict the electrostatic channel to around 0.2 $\mu$m, and under these conditions the motion of the electrons is one-dimensional in a quantum mechanical sense. The resistance of the constriction, which dominates the resistance of either device, is quantised, having values of $h/(2e^2 i)$, where h = Planck's constant, e = electronic charge, and i is an integer = number of one-dimensional sub-bands present. In a one-dimensional situation the density in energy of electron states is given by $1/(hv(E))$, where $v(E)$ is the electron velocity at energy E. Since the current J is given by summing the probability of transmission, $|t|^2$, of all possible incident electrons arriving at the constriction, i.e. $J = e \int n(E) v(E) |t(E)|^2 dE$, this becomes $J = e/h \int |t(E)|^2 dE$. For a source-drain bias of V, the integral is taken FIG. 5) from $E_f - eV$ to $E_f$, where $E_f$ is the Fermi energy, the maximum kinetic energy of electrons in the two-dimensional electron gas near the source, and is given by $E_f = h^2 n / 8\pi m^*$ where h is Planck's constant, n is the electron density per unit area in the two-dimensional electron gas and $m^*$ is the effective mass from the GaAs conduction bands. For very small source/drain bias voltages, the source and drain side electron states appear similar to each other, and $t(E) \equiv 1$ to a good approximation. Hence, $J = 2e^2 V/h$. In practice several (say i), one-dimensional sub-bands are present in parallel, and the quantised resistance follows directly from the ratio V to J.

Figure 6:
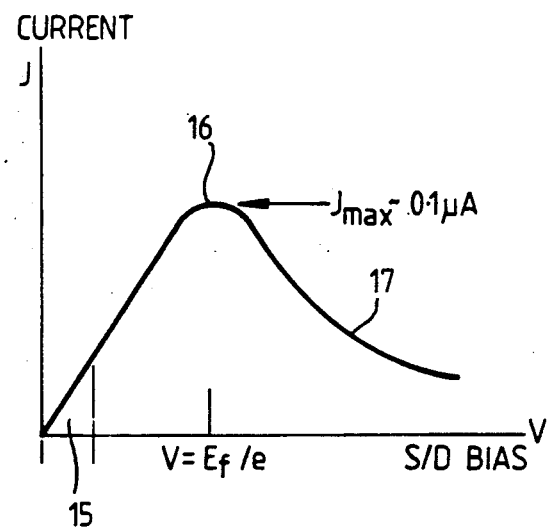
FIG. 6 is a schematic curve of current flow versus source/drain bias voltage for the semiconductor devices.

In working with such devices previously, only these small values of source/drain bias voltage V have been considered by the operators, and the devices have operated with a substantially linear current voltage characteristic, such as in a region 15 of FIG. 6. No attempt has previously been made to investigate what happens if the source-drain bias voltage is considerably increased.

The present inventors have extrapolated the result of quantisation theoretically, and have found that as the source/drain bias V is increased, the current reaches a mathematical maximum value at a point 16 where $V = E_f/e$. If $V > E_f/e$, then the integral above is taken from 0 to $E_f$. Theoretical analysis shows that $|t(E)|$ thereafter decreases monotonically from unity, and the current J therefore decreases. A negative differential resistance region 17 is therefore encountered, and this is a quite different situation from that previously accepted, in which the device merely presents a constant positive resistance. The negative differential resistance is comparable in size, but greater than the positive resistance. The existence of negative differential resistance in the device has been confirmed experimentally.

Figure 7:
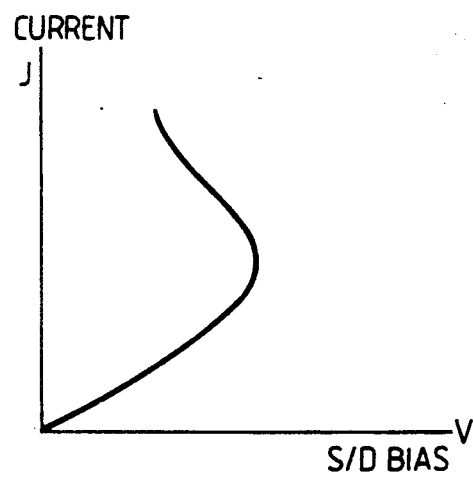
FIG. 7 is a schematic curve of current flow versus source/drain bias for an alternative mode of operation of the semiconductor devices.

A second mode of operation is possible, which leads to an S-type current/voltage characteristic, rather than the N-type just described and as shown in FIG. 6. Just as the gate-voltage defines the electrostatic constriction through which the electron motion is one-dimensional, the source-drain bias voltage can have a small effect on the channel shape. Under certain conditions of gate voltage, it is just possible that the source-drain bias is sufficient to allow another subband to become occupied. In this case, for the same bias, an extra contribution to the current will come from this new subband. This will behave just as if an extra current filament were present, leading to current instabilities, an S-type J-V curve (FIG. 7), a decreasing differential resistance for smaller biases (as opposed to increasing differential resistance in the N-type case described above), and ultimately negative differential resistance.

It will be appreciated that the negative resistance phenomenon turns the device into a very useful component for generating very high frequency oscillations. Its capacitance is extremely low; of the order of, say, $10^{-18}$F. This low value is achieved because the area A of the capacitance at the constriction is only that given by the width of the constriction multiplied by the thickness of the two-dimensional electron gas (only a few nanometers), while the value of d in the capacitance equation $C=\epsilon A/d$ is the very small length of the constriction. The low capacitance value allows very fast operation of the device. The cutoff frequency $(2\pi RC)^{-1}$ is of the order of $10^{13}-10^{14}$ Hz.

The current per constriction is low, say $10^{-7}$ amp, and the power handling capability is small, because the Fermi-energy is of the order of 0.01 eV, so the source/drain bias is limited to a value of the order of 0.1 volt. There will be, in practice, 2-10 sub-bands. For 2-10 sub-bands the positive resistance for low source/drain bias will be of the order of 2.5 k$\Omega$ (i.e. 25.7 k$\Omega$/(2-10)). The calculated negative differential resistance has a magnitude of, say, twice that of the positive resistance, so for power calculations $$V^2/R \sim (0.1 V)^2/5kl$$

i.e. of the order of $10^{-6}$ watts per constriction. A hundred of the devices might be integrated in parallel, giving a useful component which will handle say 0.1 mW at an operating frequency of, say, 1 THz.

If the source/drain bias is set at a value around the point 16, so that the device operates over a non-linear current/voltage characteristic region, the device may be used as a very high frequency detector or mixer.

The above analysis applies most accurately at low temperatures (i.e. less than 77° K.) where the effects are expected to be most prominent. However, the twin requirements of a maximum available current and a transmission coefficient which decreases with increasing bias still apply at room temperature. Thermally-induced scattering may reduce the extent of the negative differential resistance in the region 17 at higher temperatures.

We claim:

1. Semiconductor apparatus comprising a semiconductor device having a first layer of a first undoped semiconductor material, a second layer of an at least partially doped second semiconductor material of higher electron energy band gap than said first material and forming a heterojunction with said first layer whereby electrons from said second layer collect in said first layer to form a two-dimensional electron gas, spaced-apart drain and source contacts on said second layer, and a gate electrode associated with said second layer and located between said drain and source contacts, said gate electrode being configured such that on application of a negative bias of sufficient magnitude to said gate electrode at least one constriction is formed in said first layer through which only a one-dimensional electron gas can pass between the source and drain contacts; said apparatus further comprising means to apply between the source and drain contacts a bias voltage substantially equal to or greater than $E_f/e$, where $E_f$ is the Fermi energy of electrons in said two-dimensional electron gas and e is the electron charge, the Fermi energy being given by $E_f = h^2 n/8\pi m^*$ where h is Planck's constant, n is the electron density per unit area in the two-dimensional electron gas and $m^*$ is the effective mass from the GaAs conduction bands.

2. Apparatus as claimed in claim 1, wherein said first semiconductor layer comprises a layer of GaAs and said second layer comprises a layer of AlGaAs.

3. Apparatus as claimed in claim 2, wherein said second layer comprises a layer of $Al_xGa_{1-x}As$, where x is in a range between about 0.25 and 0.4.

4. Apparatus as claimed in claim 2, wherein part of the thickness of the AlGaAs layer adjacent the GaAs layer is substantially undoped and the remainder of the layer is doped.

5. Apparatus as claimed in claim 1, wherein the gate electrode comprises an electrically-conductive strip having at least one narrow transverse gap therein under which said constriction is formed.

6. Apparatus as claimed in claim 1, wherein the gate electrode comprises an electrically-conductive strip which passes over at least one dielectric spacer at a crossing point, said constriction being forced beneath the crossing point.

7. Apparatus as claimed in claim 1, wherein the applied source/drain bias voltage is substantially equal to $E_f/e$, whereby the device operates in a non-linear region of its current/voltage characteristic for use as a detector or mixer.

8. Apparatus as claimed in claim 1, wherein the applied source/drain bias voltage is greater than $E_f/e$, whereby the device operates in a negative differential resistance region of its current/voltage characteristic for use in an oscillatory circuit.

* * * * *